United States Patent [19]
Volz et al.

[11] Patent Number: 5,313,368
[45] Date of Patent: May 17, 1994

[54] ELECTRICAL CONNECTIONS BETWEEN PRINTED CIRCUIT BOARDS AND INTEGRATED CIRCUITS SURFACE MOUNTED THEREON

[75] Inventors: Keith L. Volz, Jamestown; Frederick R. Deak, Kernersville; Robert M. Renn, Pfafftown; David C. Johnson, Winston Salem; Robert D. Irlbeck, Greensboro, all of N.C.

[73] Assignee: The Whitaker Corporation, Wilmington, Del.

[21] Appl. No.: 12,170

[22] Filed: Feb. 2, 1993

[51] Int. Cl.[5] .............................................. H01R 9/00
[52] U.S. Cl. .................................... 361/774; 361/736; 361/760; 361/776; 361/813; 174/255; 439/70; 439/74; 257/690
[58] Field of Search ............... 361/395, 397, 400, 401, 361/403, 413, 417, 421, 772, 736, 748, 760, 761, 767, 785, 807, 813, 774, 776; 174/255, 257; 257/666, 690, 779; 439/55, 70, 74

[56] References Cited

FOREIGN PATENT DOCUMENTS 2111093  4/1990  Japan .
2152210  2/1992  Japan .
4192596  7/1992  Japan .

Primary Examiner—Leo P. Picard
Assistant Examiner—Young Whang

[57] ABSTRACT

A flexible electrical connector (16) provides a circuit interface between the bent leads (12) of an integrated circuit package (10) and the respective circuit pads (14) of a printed circuit board (15). The integrated circuit package (10) is mounted on the surface of the printed circuit board (15), and the circuit interface has a substantially zero insertion force therebetween. The flexible electrical connector (16) has closely-spaced circuit traces (17) carried by an elastomeric core (18). The traces (17) accommodate the fine pitch of the leads (12) on the integrated circuit package (10); and the elastomeric core (18) provides a resilient "cushion" which compensates for irregularities or tolerance accumulations in the bent leads (12) as well as the different lead-bending specifications of the respective integrated circuit manufacturers.

8 Claims, 6 Drawing Sheets

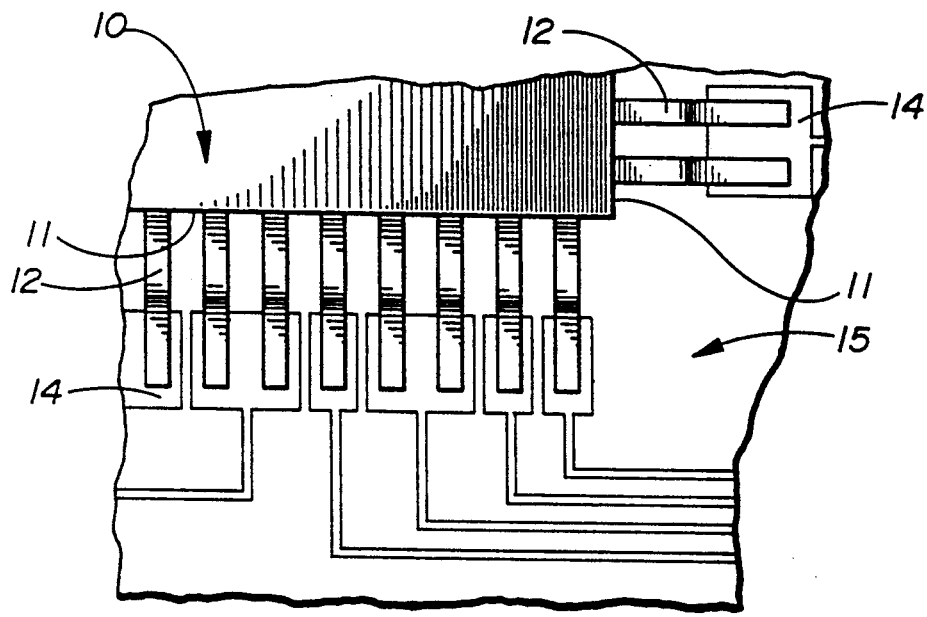
FIG. 4
PRIOR ART
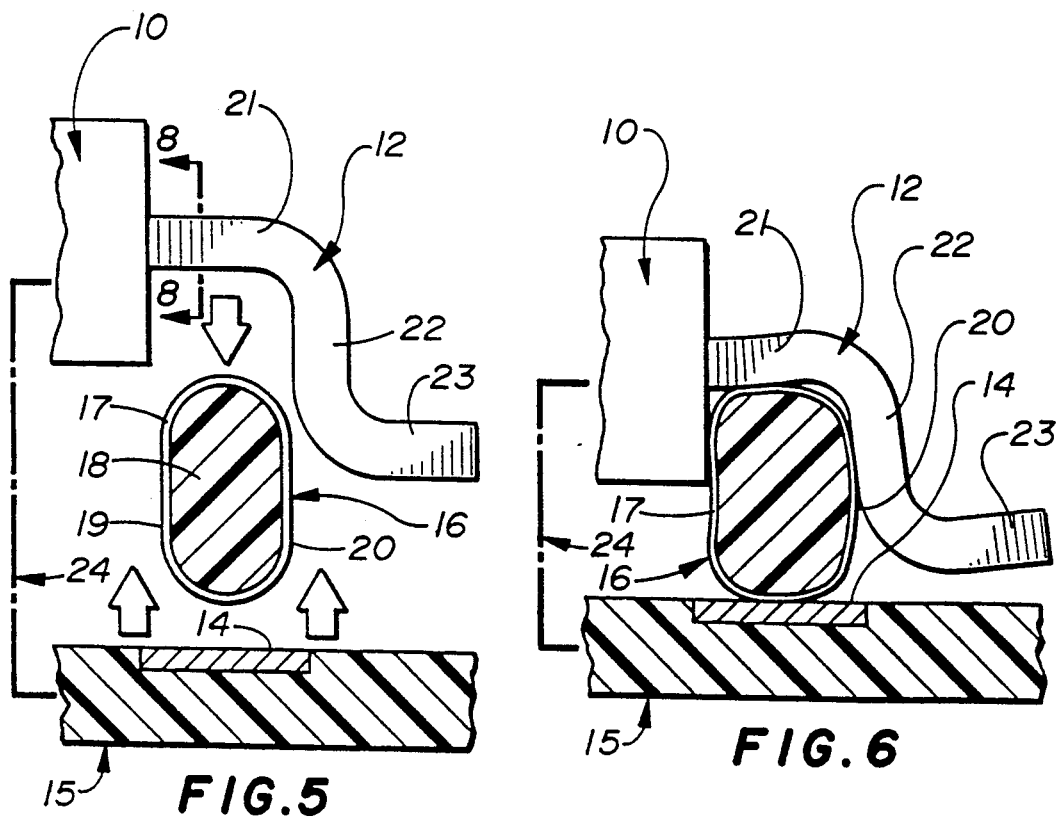
FIG.5     FIG.6

ELECTRICAL CONNECTIONS BETWEEN PRINTED CIRCUIT BOARDS AND INTEGRATED CIRCUITS SURFACE MOUNTED THEREON

FIELD OF THE INVENTION

The present invention relates to integrated circuit packages surface-mounted on printed circuit boards, and more particularly, to the electrical connections between the protruding legs or leads of the integrated circuit package and the respective circuit elements or pads on the printed circuit board.

BACKGROUND OF THE INVENTION

Integrated circuit packages are generally planar and have a plurality of leads projecting laterally and generally downwardly therefrom, as for example, in a so-called "gull wing" design. These leads, in turn, are soldered to respective circuit pads on a printed circuit board, the integrated circuit package being mounted on the surface of the printed circuit board (or "PCB").

Production difficulties are encountered, however, in soldering the leads to the PCB for a number of reasons: First, the leads are not always bent uniformly, either because of tolerance accumulations in production, or because of subsequent shipment or handling; second, the integrated circuit package manufacturers have different specifications for bending or forming the leads; and third, the lateral spacing between adjacent leads is relatively close, that is, the leads have a fine pitch. These production difficulties reduce efficiency and increase costs and, besides, permanent soldered connections interfere with service and maintenance of the equipment out in the field and, especially, upgrading the equipment to use more powerful integrated circuits.

SUMMARY OF THE INVENTION

Accordingly, it is an object of the present invention to provide a unique connection means between the protruding legs of an integrated circuit package and the respective circuit pads of a printed circuit board upon which the integrated circuit package is surface mounted.

It is a further object of the present invention to provide a flexible electrical connector which readily accommodates closely-spaced leads while compensating for different specifications or tolerance accumulations in the lead-bending processes.

In accordance with the teachings of the present invention, there is herein disclosed and claimed, the combination of: an integrated circuit package having a plurality of bent leads protruding therefrom, the bent leads having a relatively small pitch laterally therebetween; an electronic assembly having a plurality of circuit elements thereon, the integrated circuit package being mounted on the electronic assembly; and at least one flexible electrical connector between the bent leads on the integrated circuit package and the circuit elements on the electronic assembly. As a result, a circuit interface is provided with a substantially zero insertion force between the integrated circuit package and the electronic assembly, while compensating for any irregularities or tolerance accumulations in the bent leads with respect to the integrated circuit package.

Preferably, the electronic assembly comprises a printed circuit board having a plurality of circuit pads, and the integrated circuit package is mounted on the surface of the printed circuit board.

In a preferred embodiment, the flexible electrical connector includes an elastomeric core having a plurality of relatively closely-spaced conductive traces thereon, the traces providing the circuit interface between the bent leads on the integrated circuit package and the circuit pads on the printed circuit board, and the elastomeric core providing a resilient loading therebetween.

These and other objects of the present invention will become apparent from a reading of the following specification taken in conjunction with the enclosed drawings.

BRIEF DESCRIPTION OF THE DRAWINGS

FIG. 4 is a top plan view of a portion of FIG. 3, drawn to an enlarged scale.

FIG. 5 is an exploded view (partly in section and partly in elevation) and schematically illustrating the present invention, wherein a flexible electrical connector is disposed between a "gull wing" lead (for example) on the integrated circuit package and a respective circuit pad on the printed circuit board.

FIG. 6 corresponds substantially to FIG. 5, but shows the parts in their assembled relationship, such that the elastomeric core of the flexible electrical connector is compressed to alleviate different specifications or tolerance accumulations in the lead-bending processes.

DESCRIPTION OF THE PREFERRED EMBODIMENTS

Figure 1:
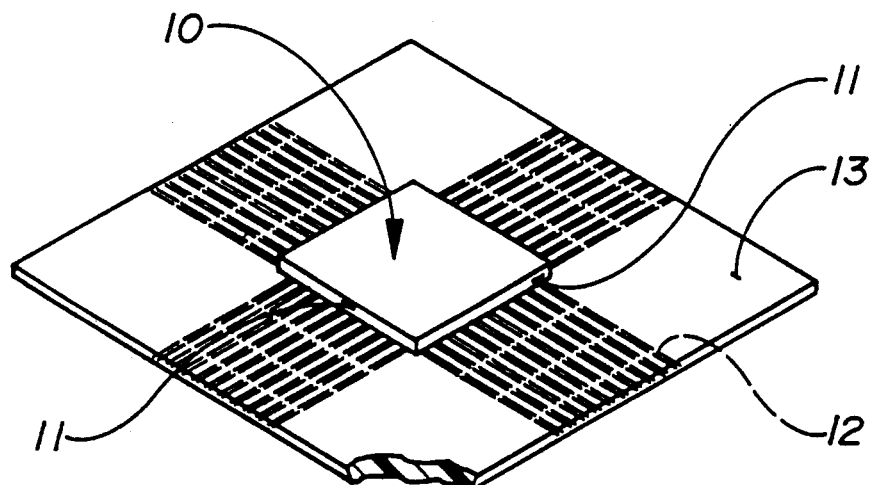
FIG. 1 is a perspective view of an integrated circuit package or "chip" with a molded carrier ring, as used in the prior art.
Figure 2:
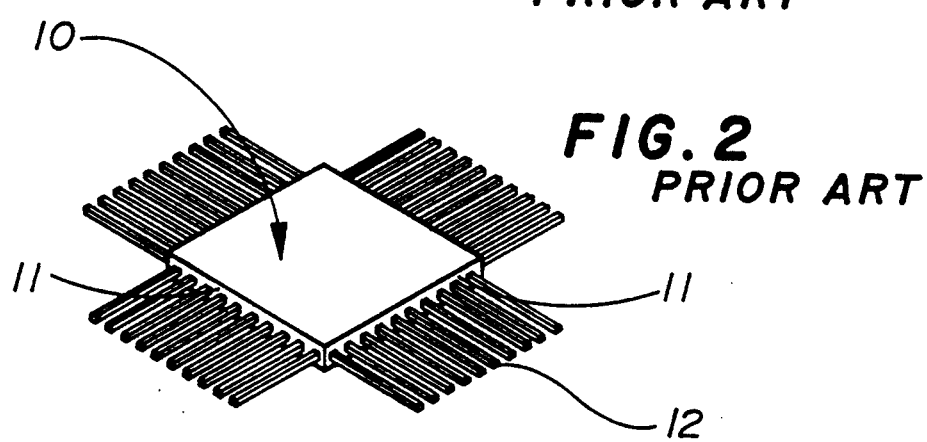
FIG. 2 is a perspective view of a prior art integrated circuit package, wherein the leads are free standing.
Figure 3:
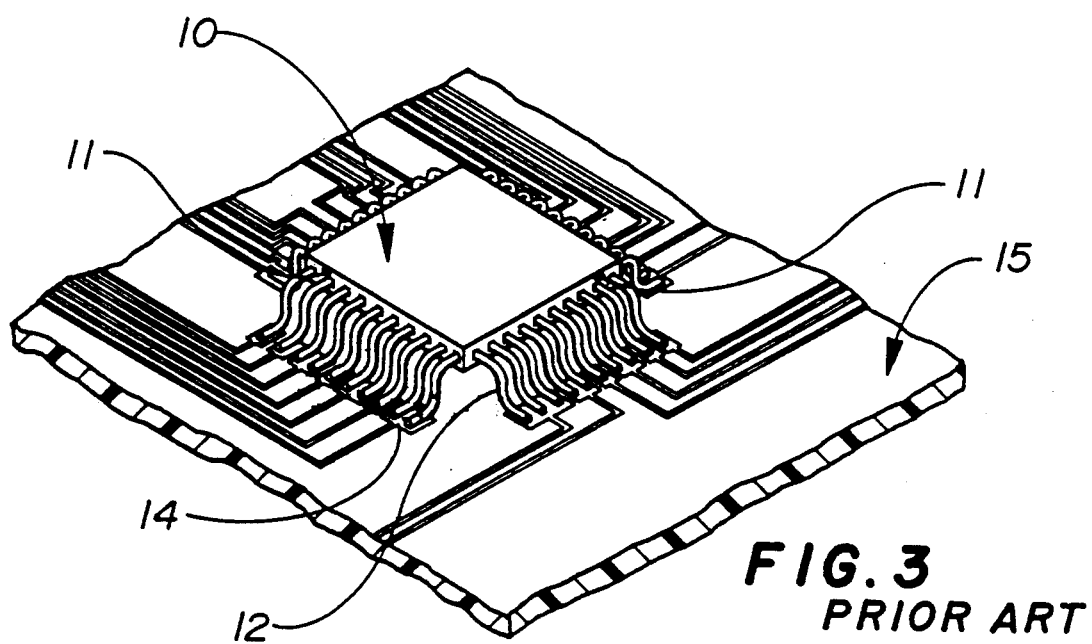
FIG. 3 is a perspective view of a prior art integrated circuit package, wherein the leads are bent downwardly and outwardly in a so-called "gull wing" design, wherein the leads are connected to respective circuit elements or pads on a printed circuit board ("PCB"), and wherein the integrated circuit package is mounted on the surface of the PCB.

With reference to the prior art shown in FIGS. 1-4, an integrated circuit package 10 is substantially rectangular or square and has respective side edges 11 from which a plurality of closely-spaced leads 12 protrude. These leads 12, which are usually substantially square in cross-section, may be encapsulated in a molded plastic carrier or ring 13 (as shown in FIG. 1) or may be free standing (as shown in FIG. 2) or may be bent downwardly and outwardly therefrom in a so-called "gull wing" design (as shown in FIG. 3). In FIGS. 3 and 4, the leads 12 are soldered (or otherwise suitably secured) to respective circuit elements or pads 14 on a printed circuit board 15.

Figure 7:
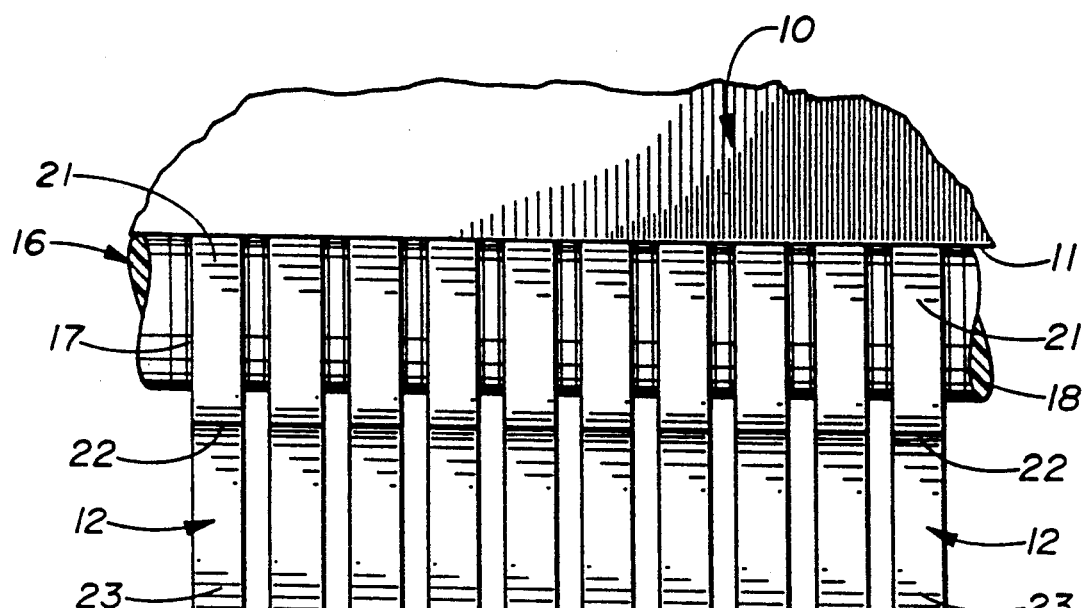
FIG. 7 is a partial top plan view thereof.

In accordance with the invention, and with reference to FIGS. 5-7, a flexible electrical connector 16 is disposed between the bent leads 12 on the integrated circuit package 10 and the respective circuit pads 14 on the printed circuit board 15. The flexible electrical connector 16 has a plurality of finely-spaced circuit elements or traces 17 carried by an elastomeric core 18. The traces 17 are formed by a gold-plating on a nickel-clad copper foil carried by a thin polymer film which, in turn, is suitably wrapped around the elastomeric core 18. Typically, the traces 17 are three mils wide on seven mils center-to-center spacing, such that the spacing between adjacent traces 17 is four mils. A complete line of high-quality flexible electrical connectors 16 is supplied by AMP International, Inc. of Harrisburg, Pa., U.S.A., under its registered trademark "AMPLIFLEX".

Figure 8:
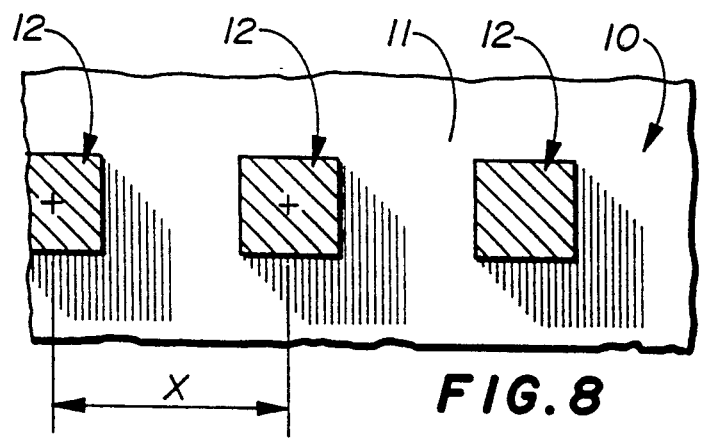
FIG. 8 is a cross-sectional view, taken along the lines 8—8 of FIG. 5, and showing the spacing between adjacent leads.
Figure 9:
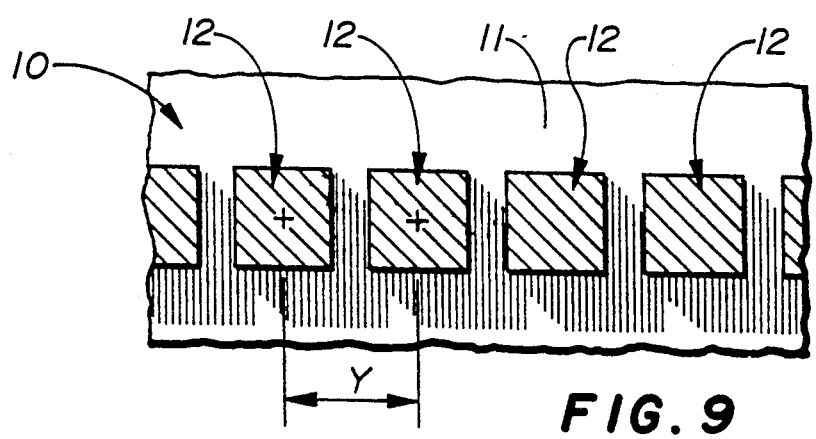
FIG. 9 is a cross-sectional view, corresponding substantially to FIG. 8, but showing an improved integrated circuit package having a relatively-high circuit density and, accordingly, a relatively close lead spacing or pitch.

As will be appreciated in FIGS. 8 and 9, the flexible electrical connector 16 will accommodate the relatively-close lateral spacing or pitch between adjacent leads 12 on the integrated circuit package 10 (denoted by X in FIG. 8) as well as the especially relatively-close pitch (denoted by Y in FIG. 9) of the more powerful higher-circuit-density integrated circuits 10 which are becoming increasingly more popular with the manufacturers of electronic equipment.

The features and advantages of the present invention are illustrated schematically in FIGS. 10A, 10B, 11A and 11B, and will be readily appreciated by those skilled in the art.

Figure 10A:
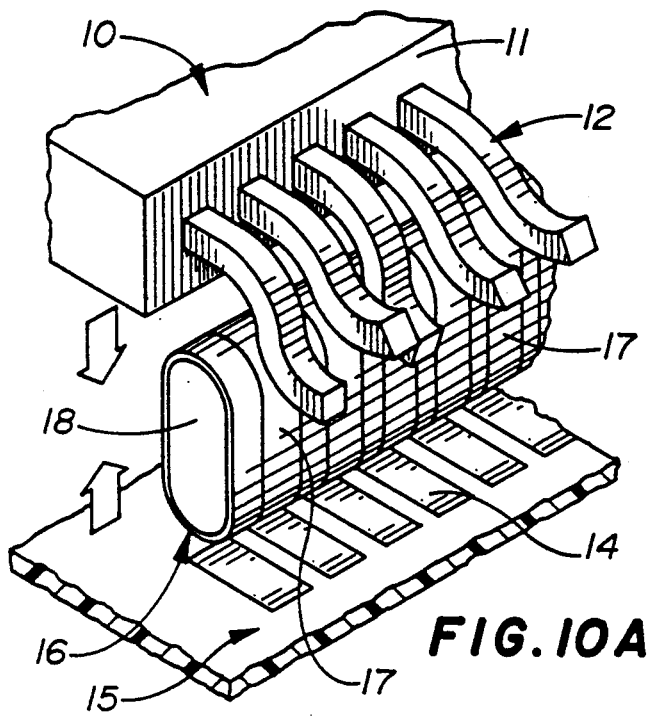
FIG. 10A is a partial perspective view of a prior art integrated circuit package, wherein the leads are bent irregularly with respect to each other, and wherein a flexible electrical connector provides the circuit interface between the integrated circuit package and the printed circuit board in accordance with the present invention.

In FIG. 10A, the leads 12 are bent irregularly with respect to each other, indicative of a tolerance accumulation in the lead-bending processes or in the subsequent handling of the integrated circuit package 10. Nevertheless, and as shown more clearly in FIG. 10B, the flexible electrical connector 16 readily accommodates these irregularly-bent leads 12 and, in effect, compensates for the tolerance accumulations in the bent leads 12, since the elastomeric core 18 of the flexible electrical connector 16 is compressed to provide a resilient loading or "cushion" between the leads 12 on the integrated circuit package 10 and the circuit pads 14 on the printed circuit board 15.

Although it is quite possible that under certain conditions, the leads 12 may be bent uniformly to have a substantially zero tolerance therebetween, nevertheless, the respective manufacturers of integrated circuits have different specifications on the manner and degree of bending of the leads 12 with respect to the integrated circuit package 10. This is illustrated schematically in FIG. 11A, where the leads 12 are uniform with respect to each other, but where the downward and outward bending of the leads 12 is more pronounced than that shown in FIG. 10A. However, the flexible electrical connector 16 readily accommodates this different lead-bending specification, as shown more clearly in FIG. 11B.

Figure 10B:
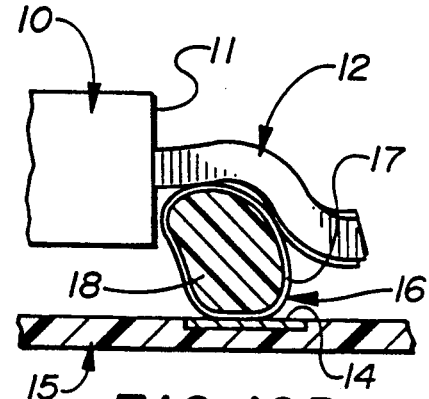
FIG. 10B is a cross-sectional view corresponding substantially to FIG. 10A, but showing how the flexible electrical connector (of FIGS. 5–7) compensates for the irregularities in the bent leads or the tolerance accumulations between the bent leads and the integrated circuit package.

Thus, the flexible electrical connector 16, in combination with the integrated circuit package 10 and the printed circuit board 15, achieves quite a number of major objectives. The finely-pitched traces 17 on the flexible electrical connector 16 readily accommodate the very closely-pitched leads 12 on the integrated circuit package 10 (as shown in FIGS. 7-9). The flexible electrical connector 16 compensates for irregularities or tolerance accumulations in the bent leads 12 (as shown in FIG. 10B) and readily accommodates the different lead-bending specifications of the respective integrated circuit manufacturers (as shown in FIG. 11B). Additionally, the flexible electrical connector 16 provides a circuit interface between the leads 12 on the integrated circuit package 10 and the respective circuit pads 14 on the printed circuit board 15; and this circuit interface has a substantially zero insertion force (referred to in the art as the "ZIF") therebetween, thereby precluding inadvertent damage to the flexible electrical connector 16 (as well as the other components).

All of these objectives are achieved simultaneously by the present invention. These are very valuable features and advantages, heretofore not available in the prior art.

Figure 12:
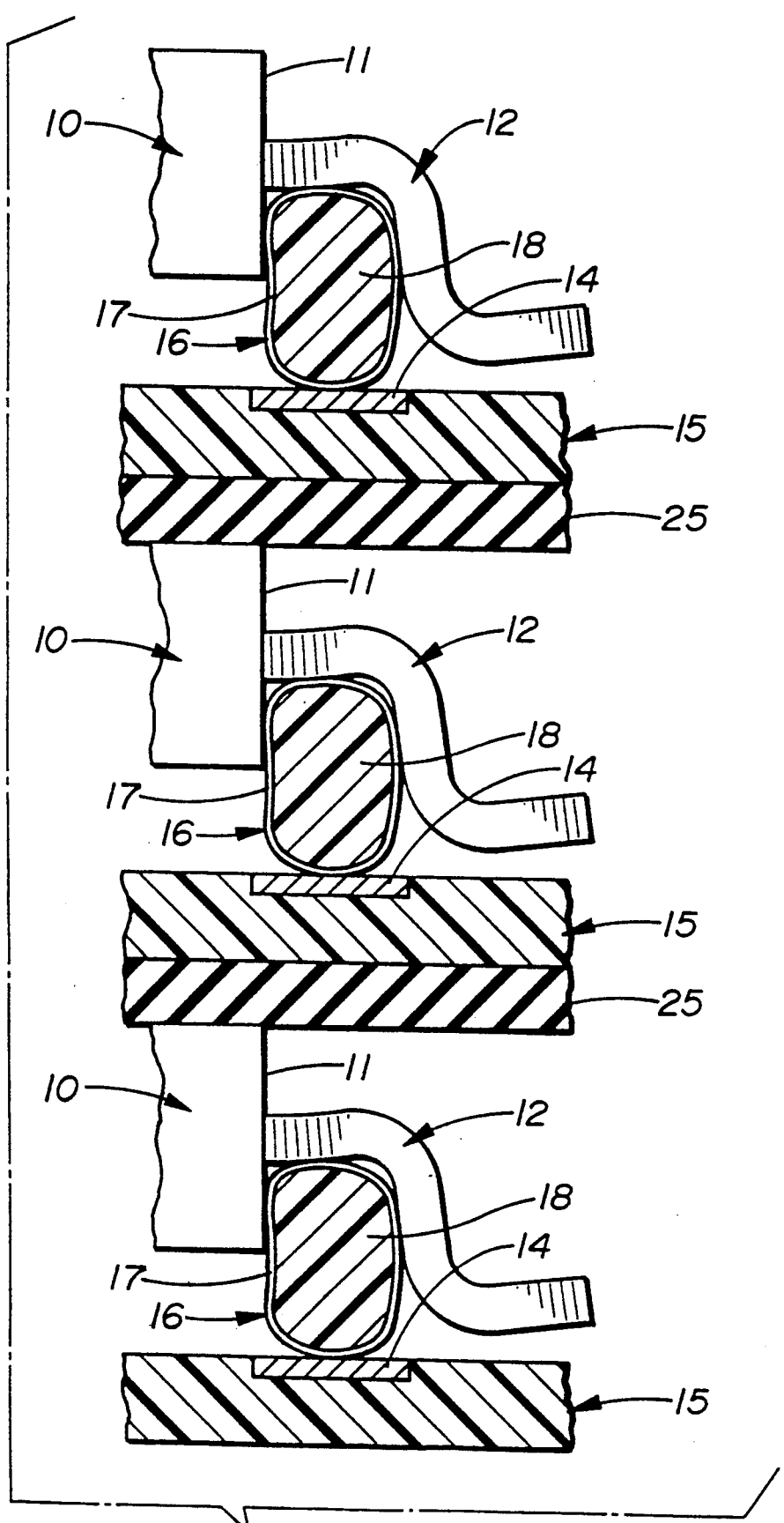
FIG. 12 is a cross-sectional view, partly in elevation, showing how the teachings of the present invention facilitate a plurality of integrated circuit packages and associated printed circuit boards and their respective flexible electrical connectors therebetween, stacked conveniently about the "Z" or vertical axis with respect to each other.

Another advantage of the present invention is shown in FIG. 12. There, a plurality of surface-mounted integrated circuit packages 10 are stacked vertically (along a so-called "Z" axis) together with their respective printed circuit boards 15 and respective flexible electrical connectors 16. This vertical stacking of integrated circuit packages surface-mounted on PCB's was not readily available, nor even feasible, in the prior art; yet vertical stacking arrangements are very desirable, if not mandatory, in sophisticated and increasingly miniaturized electronic equipment.

Figure 13:
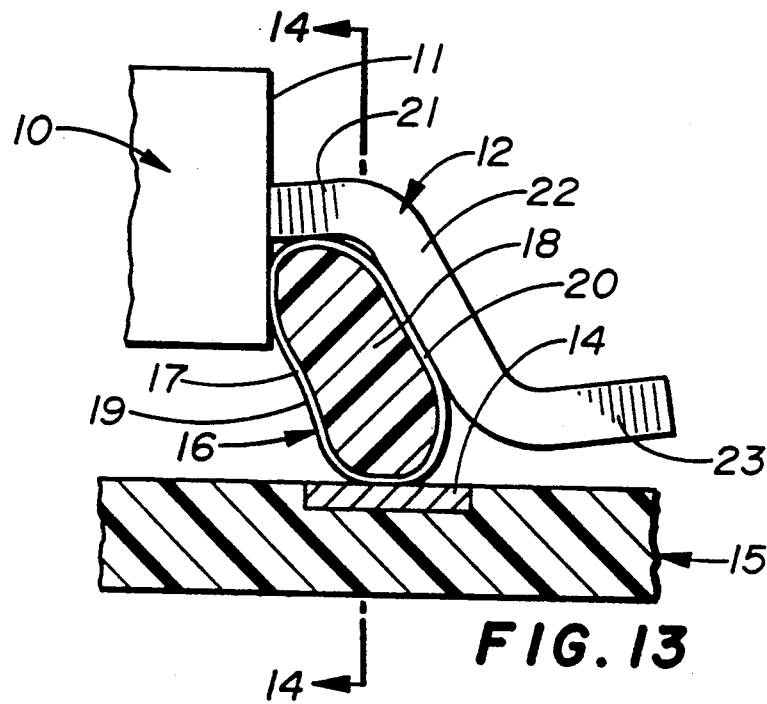
FIG. 13 is a further cross-sectional view, corresponding substantially to FIG. 6, but showing how the flexible electrical connector may be angled with respect to the leads on the integrated circuit package and the circuit pads on the printed circuit board, such that the electrical connection is made along one of the substantially parallel sides of the substantially oval shaped flexible electrical connector and the respective downwardly-extending intermediate portion of the bent lead.

In most cases the flexible electrical connector 16 will be compressed, as shown in FIG. 13, depending upon the particular configuration of the leads 12 and the printed circuit board 15. Preferably, the flexible electrical connector 16 is substantial oval-shaped (in cross section) and includes substantially parallel sides 19 and 20. Each of the leads 12, on the other hand, has a first portion 21 extending from the integrated circuit package 10, a second downwardly and outwardly bent intermediate portion 22, and a third free end portion 23, all of which are integral with each other. The electrical connection is usually made, substantially, between the side 20 of the flexible electrical connector 16 and the second intermediate portion 22 of the bent lead 12, as shown more clearly in FIG. 13.

Any suitable means may be provided for mounting the integrated circuit package 10 on the surface of the printed circuit board 15, as shown schematically at 24 in FIGS. 5 and 6. Additionally, a suitable spacing means, denoted at 25, may be provided in the vertically-stacked arrangement of FIG. 12.

Figure 11A:
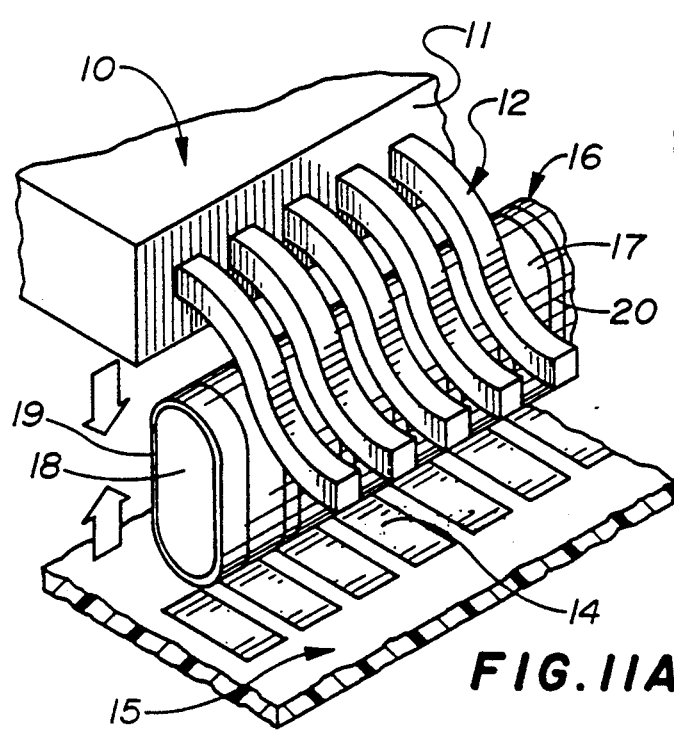
FIG. 11A is a partial perspective view of a prior art integrated circuit package, corresponding substantially to FIG. 10A, but showing that an integrated circuit package from a different manufacturer has leads which are bent to a different specification from that of FIG. 10A.
Figure 11B:
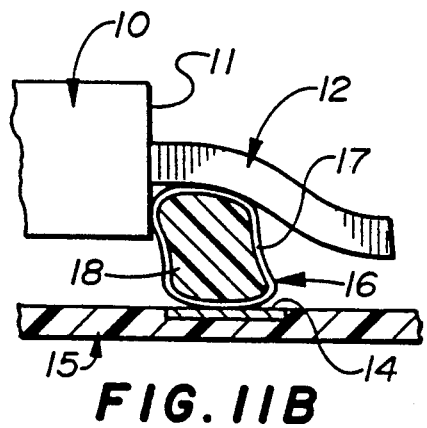
FIG. 11B is a cross-sectional view, corresponding substantially to FIG. 11A, but showing how the flexible electrical connector readily accommodates the different lead-bending specifications of the respective integrated circuit manufacturers.
Figure 14:
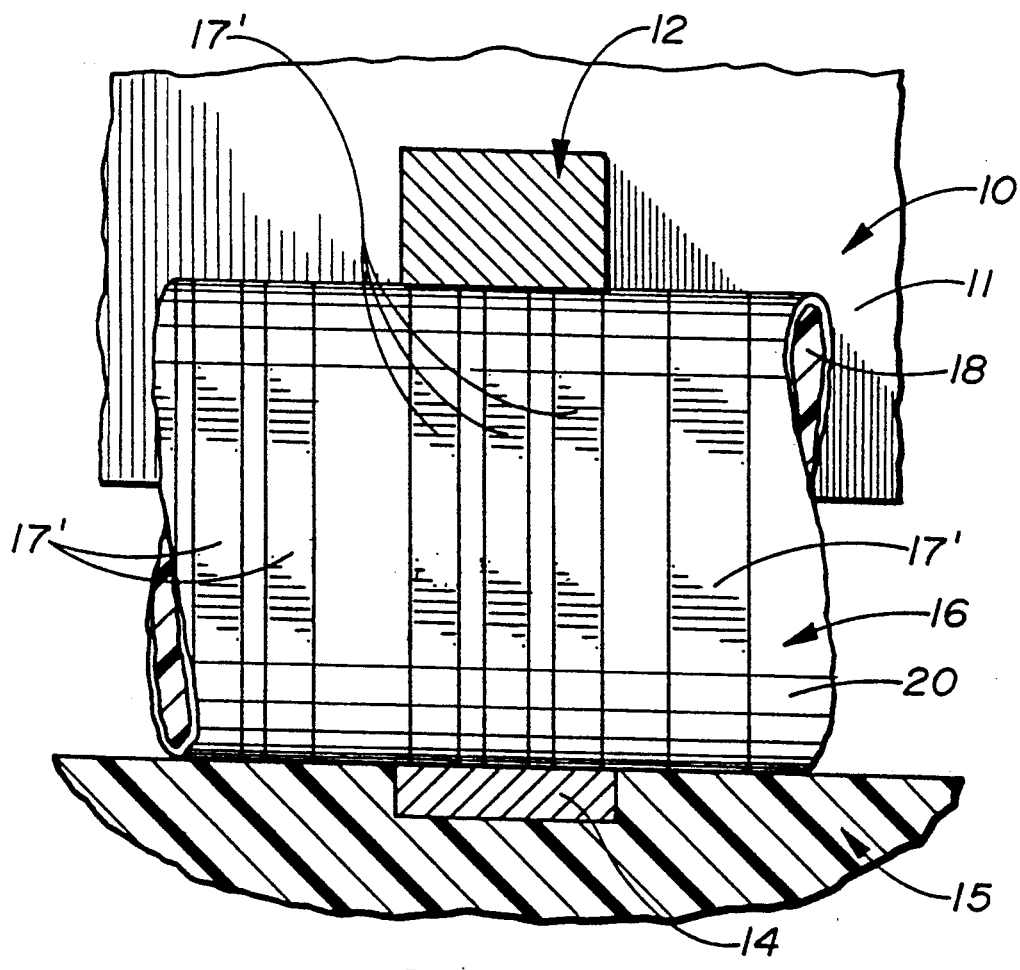
FIG. 14 corresponds to a portion of FIG. 11A, but shows a plurality of conductive traces on the flexible electrical connector providing the circuit interface with one of the leads on the integrated circuit package (as well as with one of the pads on the printed circuit board).

In the previous drawings, such as FIGS. 10A and 11A, a conductive trace 17 on the flexible electrical connector 16 is dedicated, that is, a single trace 17 provides the circuit interface with a respective lead 12 on the integrated circuit package 10. However, and as shown more clearly in FIG. 14, a plurality of conductive traces 17' on the flexible electrical connector 16 provides the circuit interface with a respective lead 12. Preferably, at least three traces 17' are used per lead 12; however, depending upon the particular product application, four (or more) traces 17' may be used. The same is also true for the circuit pads 14 on the printed circuit board 15.

Obviously, many modifications may be made without departing from the basic spirit of the present invention. Accordingly, it will be appreciated by those skilled in the art that within the scope of the appended claims, the invention may be practiced other than has been specifically described herein.

What is claimed is:

1. A combination of an integrated circuit package having a plurality of bent leads protruding therefrom, where the bent leads have a relatively small pitch laterally therebetween, and a printed circuit board having a plurality of circuit pads thereon, and wherein the integrated circuit package is surface mounted to said printed circuit board, the combination including means for mounting the integrated circuit package on the printed circuit board, and at least one flexible electrical connector between the bent leads on the integrated circuit package and the circuit pads on the printed circuit board, where the flexible electrical connector comprises an elastomeric core having a plurality of relatively closely-spaced conductive traces thereon, the traces providing a circuit interface between the bent leads on the integrated circuit package and the circuit pads on the printed circuit board, and the elastomeric core providing a resilient loading therebetween, whereby to provide the circuit interface with a substantially zero insertion force between the integrated circuit package and the printed circuit board to compensate for any irregularities and tolerance accumulations in the bent leads with respect to the integrated circuit package.

2. The combination of claim 1, wherein the flexible electrical connector has a cross-section which is essentially oval in configuration and includes a pair of substantially parallel sides, wherein each lead includes a first portion projecting from the integrated circuit package and a second portion, integral with the first portion and projecting downwardly and outwardly therefrom, and wherein the respective second portions of the leads are in physical contact with one of the parallel sides of the flexible electrical connector as the elastomeric core thereof is compressed between the leads and the printed circuit board.

3. The combination of claim 1, wherein the bent leads are formed downwardly of the integrated circuit package and outwardly therefrom.

4. The combination of claim 1, wherein a plurality of integrated circuit packages and respective printed circuit boards are stacked vertically.

5. A combination of an integrated circuit package having a plurality of leads protruding therefrom, where the leads have a relatively small pitch therebetween, and the leads are formed downwardly of the integrated circuit package and outwardly therefrom, and a printed circuit board having a plurality of circuit pads thereon, mounting means for surface mounting the integrated circuit package on the printed circuit board, and at least one flexible electrical connector disposed between the leads and the printed circuit board, the flexible electrical connector including an elastomeric core having a plurality of relatively closely-spaced conductive traces thereon, the traces providing a circuit interface with a substantially zero insertion force between the leads on the integrated circuit package and the circuit pads on the printed circuit board, and the elastomeric core providing a resilient loading therebetween which compensates for irregularities and tolerance accumulations between the leads and the integrated circuit package.

6. The combination of claim 5, wherein each trace on the flexible electrical connector is dedicated to a respective lead on the integrated circuit package.

7. The combination of claim 5, wherein a plurality of traces on the flexible electrical connector provides the circuit interface with a respective lead on the integrated circuit package.

8. The combination of claim 7, wherein the plurality of traces on the flexible electrical connector comprises at least three traces.

* * * * *